(12) United States Patent
Isaji et al.

(10) Patent No.: US 12,014,888 B2
(45) Date of Patent: Jun. 18, 2024

(54) CIRCUIT ASSEMBLY

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yusuke Isaji, Mie (JP); Ryoya Okamoto, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 309 days.

(21) Appl. No.: 17/605,417

(22) PCT Filed: Apr. 14, 2020

(86) PCT No.: PCT/JP2020/016463
§ 371 (c)(1),
(2) Date: Oct. 21, 2021

(87) PCT Pub. No.: WO2020/218091
PCT Pub. Date: Oct. 29, 2020

(65) Prior Publication Data
US 2022/0189719 A1  Jun. 16, 2022

(30) Foreign Application Priority Data

Apr. 25, 2019  (JP) ................................. 2019-084486

(51) Int. Cl.
*H01H 45/00* (2006.01)
*B60R 16/02* (2006.01)
(Continued)

(52) U.S. Cl.
CPC .............. *H01H 45/12* (2013.01); *B60R 16/02* (2013.01); *H01H 47/00* (2013.01); *H02G 3/16* (2013.01); *H02M 7/003* (2013.01); *H05K 7/06* (2013.01)

(58) Field of Classification Search
CPC ........ H01H 45/12; H01H 47/00; B60R 16/02; H02G 3/16; H02M 7/003; H05K 7/06
See application file for complete search history.

(56) References Cited

U.S. PATENT DOCUMENTS 3,857,044 A * 12/1974 Papoi .................... H05K 7/1432
307/9.1
10,806,058 B2 * 10/2020 Hiratani .................... H02G 5/10
(Continued)

FOREIGN PATENT DOCUMENTS

EP       3557603 A1 * 10/2019 ............. B60R 16/02
JP       2006-087173       3/2006
(Continued)

OTHER PUBLICATIONS

International Search Report issued in International Bureau of WIPO Patent Application No. PCT/JP2020/016463, dated Jun. 23, 2020, along with an English translation thereof.

*Primary Examiner* — Pete T Lee
(74) *Attorney, Agent, or Firm* — Greenblum & Bernstein, P.L.C.

(57) ABSTRACT

Provided is a circuit assembly including: a main relay that is to be electrically connected between a load and a battery; a pre-charge circuit connected in parallel with the main relay; and a heat transfer member, wherein the pre-charge circuit
(Continued)

includes current-carrying portions that are to be connected to the main relay, and the heat transfer member and the current-carrying portions are in contact with each other.

4 Claims, 3 Drawing Sheets

(51) Int. Cl.
    *H01H 45/12*     (2006.01)
    *H01H 47/00*     (2006.01)
    *H02G 3/16*     (2006.01)
    *H02M 7/00*     (2006.01)
    *H05K 7/06*     (2006.01)

(56) References Cited

U.S. PATENT DOCUMENTS

| | | |
|---|---|---|
| 2013/0313915 A1 | 11/2013 | Hashimoto et al. |
| 2017/0353020 A1* | 12/2017 | Yamashita ............... H02G 3/16 |
| 2020/0013573 A1 | 1/2020 | Won et al. |
| 2020/0037436 A1 | 1/2020 | Won et al. |

FOREIGN PATENT DOCUMENTS

| | | |
|---|---|---|
| JP | 2008-300090 | 12/2008 |
| JP | 2013-239581 | 11/2013 |
| JP | 2014-079093 | 5/2014 |
| JP | 2015-099834 | 5/2015 |
| WO | 2018/111001 | 6/2018 |

\* cited by examiner

CIRCUIT ASSEMBLY

TECHNICAL FIELD

The present disclosure relates to a circuit assembly that is to be electrically connected between a load and a battery of a vehicle.

BACKGROUND ART

An electric vehicle such as an electric car and a hybrid car is equipped with a power supply device including a circuit assembly that includes a relay for breaking an electrical connection between a travel battery or the like and a vehicle-side load. For example, Patent Document 1 describes a circuit assembly including a relay that interrupts supply of power from a battery to a motor or a generator that is connected, via an inverter, as a vehicle-side load.

An extremely large current of 50 A or more flows through the relay used for such a circuit assembly when the relay is connected. Accordingly, the amount of Joule heat proportional to the square of the current amount is generated, and the amount of heat generated is also increased. For this reason, Patent Document 1 proposes a structure that dissipates heat from a relay by utilizing an intermediate portion of a bus bar that connects a connection portion of the relay accommodated in a case and a connection terminal of a battery disposed outside the case. Specifically, Patent Document 1 discloses a structure in which a relay is abutted against a chassis, a casing accommodating the entire power supply device, or the like via an insulating heat dissipation sheet at an intermediate portion of a bus bar that extends to the outside of a case accommodating the relay, thereby dissipating the heat generated in the relay to the chassis or the casing through thermal conduction.

CITATION LIST

Patent Document

Patent Document 1: JP 2014-79093A

SUMMARY OF INVENTION

Technical Problem

For a bus bar constituting a current-carrying portion that connects a relay and a battery to each other, a large thickness or area needs to be ensured in order to withstand a large current. For this reason, the structure of Patent Document 1 is problematic in that a heat dissipation path needs to be additionally provided using a large bus bar, resulting in an increase in material and processing costs. In addition, the large bus bar needs to extend over a long distance to another heat dissipation member provided outside the case, and the distance between the connection portion of the relay and the heat dissipation portion is inevitably increased. Accordingly, the structure also has an inherent problem in that the heat generated in the relay is not efficiently dissipated.

Therefore, an object of the present disclosure is to provide a circuit assembly having a novel structure that increases the heat dissipation efficiency of a relay, while suppressing an increase in material and processing costs.

Solution to Problem

In the case of a power supply device installed in an electric vehicle such as an electric car and a hybrid car, a capacitor is connected in parallel with a load on the vehicle side, and power can be stably supplied to the load from both the capacitor and a battery. Also, a circuit assembly including a relay (hereinafter referred to as a "main relay") that breaks a connection between the battery and the load includes, in addition to the main relay, a pre-charge circuit in which a pre-charge relay and a pre-charge resistor used when pre-charging the capacitor are connected in series so as to bypass the main relay. With this configuration, the capacitor can be charged in advance by connecting the pre-charge relay before connecting the main relay, thus preventing the connection portion of the main relay from being damaged by a larger inrush current flowing through the capacitor when connecting the main relay. A circuit assembly according to the present disclosure efficiently achieves heat dissipation of the main relay by using a novel structure utilizing the pre-charge circuit.

A circuit assembly according to the present disclosure is a circuit assembly including: a main relay that is to be electrically connected between a load and a battery; a pre-charge circuit connected in parallel with the main relay; and a heat transfer member, wherein the pre-charge circuit includes a current-carrying portion that is to be connected to the main relay, and the heat transfer member and the current-carrying portion are in contact with each other.

Advantageous Effects of Invention

According to the present disclosure, it is possible to provide a circuit assembly having a novel structure that can increase the heat dissipation efficiency of a relay, while suppressing an increase in the material and processing costs.

DESCRIPTION OF EMBODIMENTS

Description of Embodiments of the Present Disclosure

First, aspects of the present disclosure will be listed and described.

A circuit assembly according to the present disclosure is
(1) a circuit assembly including: a main relay that is to be electrically connected between a load and a battery; a pre-charge circuit connected in parallel with the main relay; and a heat transfer member, wherein the pre-charge circuit includes a current-carrying portion that is to be connected to the main relay, and the heat transfer member and the current-carrying portion are in contact with each other.

With the circuit assembly according to the present disclosure, in the pre-charge circuit provided in the vicinity of the main relay the heat transfer member is in contact with at least a partial region of the current-carrying portion that is to be connected to the bus bar connected to the main relay. Therefore, in the vicinity of the connection portion of the main relay, it is possible to efficiently dissipate heat from the main relay via the heat transfer member. Moreover, since the heat transfer member may merely be brought into contact with at least a part of the current-carrying portion of an existing pre-charge circuit, there is no need to extend a large bus bar over a long distance for heat dissipation as in the case of the conventional structure. Accordingly it is possible to realize a heat dissipation structure of the main relay with a simple structure, while suppressing an increase in cost. Even when the surface area of the current-carrying portion of the pre-charge circuit is increased in order to increase the heat transfer efficiency or the like, the current-carrying portion has a smaller cross-sectional area than a current-carrying portion that connects the main relay and the battery. Therefore, it is possible to suppress an increase in cost.

Note that the current-carrying portion that is to be connected to the main relay of the pre-charge circuit refers to a portion that establishes a conductive connection between the main relay, the pre-charge relay and/or the pre-charge resistor to each other. Furthermore, as the heat transfer member that is brought into contact with the current-carrying portion, it is possible to use any heat transfer member formed by a member having a better thermal conductivity than that of air. For example, it is possible to use an insulating heat transfer sheet, a heat dissipation fin, and the like.

(2) It is preferable that the circuit assembly further includes a case that accommodates the main relay and the pre-charge circuit, wherein the heat transfer member includes a planar first heat transfer sheet in contact with the case. The reason for this is that the planar first heat transfer sheet serving as a heat transfer member is in contact with the case, and therefore the heat generated in the main relay can be transferred from the current-carrying portion of the pre-charge circuit to the first heat transfer sheet and the case, without being transferred through an air layer. As a result, it is possible to construct a more efficient heat transfer path of the main relay and a heat dissipation structure using the same. Moreover, since the case and the current-carrying portion of the pre-charge circuit are existing components, it is possible to construct a heat transfer path of the main relay with a simple structure and good space efficiency.

(3) In (2) described above, it is preferable that the heat transfer member includes a planar second heat transfer sheet disposed opposed to the first heat transfer sheet with the case interposed therebetween. The reason for this is that, due to the provision of the second heat transfer sheet disposed opposed to the first heat transfer sheet with the case interposed therebetween, the heat of the main relay can be further transferred to the outside via the second heat transfer sheet. This makes it possible to construct the heat transfer path of the main relay utilizing a larger area, and to achieve more stable heat dissipation of the main relay.

(4) In (2) or (3) described above, it is preferable that the circuit assembly further includes a holding pedestal that is to be fixed to the case so as to hold the pre-charge circuit, wherein the current-carrying portion and the first heat transfer sheet are disposed between the case and the holding pedestal, and the current-carrying portion and the first heat transfer sheet are pressed against the case as a result of the holding pedestal being fixed to the case. The reason for this is that the heat transfer path of the main relay that is formed by the current-carrying portion, the first heat transfer sheet, and the case can be provided with good space efficiency, utilizing the conventionally used space between the abutment surfaces of the holding pedestal and the case. Moreover, the current-carrying portion and the heat transfer sheet are pressed using the holding pedestal. This makes it possible to prevent loss, for example, through an air layer in the heat transfer path without requiring any additional component, thus advantageously enhancing the stability and the performance of the heat transfer path.

(5) In (4) described above, it is preferable that the current-carrying portion is formed by a planar bus bar, the bus bar is disposed such that opposite surfaces of the bus bar in a plate thickness direction thereof abut against the holding pedestal and the first heat transfer sheet, an abutment surface of each of the case and the holding pedestal is planar, and the first heat transfer sheet is flexible. The reason for this is that the current-carrying portion and the first heat transfer sheet that are planar can be sandwiched between the abutment surfaces of the flat planar case and the holding pedestal without any gap. In particular, since the first heat transfer sheet is flexible, any dimensional tolerances occurring in the case, the holding pedestal, and the bus bar can be absorbed by deformation of the first heat transfer sheet, and it is possible to reliably maintain the contact area between the members constituting the heat transfer path of the main relay, thus enhancing the heat transfer performance.

Details of Embodiments of the Present Disclosure

Specific examples of the circuit assembly according to the present disclosure will be described below with reference to the drawings. It should be noted that the present disclosure is not limited to these examples, but is defined by the claims, and is intended to include all modifications which fall within the scope of the claims and the meaning and scope of equivalents thereof.

Embodiment 1

In the following, Embodiment 1 of the present disclosure will be described with reference to FIGS. 1 to 5. A circuit assembly 10 is installed, for example, in a vehicle (not shown) such as an electric car or a hybrid car. As shown in FIG. 2, for example, the circuit assembly 10 is used to connect a travel battery to a vehicle-side load 16 via a main relay 14. Here, the travel battery refers to a battery 12, and is used as a battery for supplying power to a motor 22 for causing the vehicle to travel. Although the circuit assembly 10 may be disposed in any orientation, the following description assumes that the Z direction is upward, the Y direction is forward, and the X direction is rightward. For a plurality of identical members, reference numerals may be assigned to some of the members, and reference numerals may be omitted for the other members.

Circuit Assembly 10

As shown in FIG. 2, the output side of the battery 12 that supplies power to the motor 22 for causing the vehicle to travel is connected to the input side of the circuit assembly 10. The vehicle-side load 16 is connected to the output side of the circuit assembly 10. The main relay 14 that connects the battery 12 to the vehicle-side load 16 is connected between the input side and the output side of the circuit assembly 10. In addition, a pre-charge circuit 30 in which a pre-charge relay 26 and pre-charge resistors 28 are connected in series so as to bypass the main relay 14 is connected to the main relay 14 of the circuit assembly 10. Note that, in Embodiment 1 of the present disclosure, pre-charge resistors 28 are connected to both the input side and the output side of the pre-charge relay 26, as shown in FIG. 2. Furthermore, the main relay 14 and the pre-charge relay 26 are relays that switch a movable connection portion on and off by moving the connection portion while an exciting coil is in a conducting state, and are controlled so as to be turned on or off by a control circuit (not shown).
Battery 12

The output voltage of the battery 12 is increased to a high voltage of, for example, 100 V to 400 V by connecting a plurality of chargeable secondary batteries in series. It is also possible to increase the current capacity by connecting a plurality of secondary batteries in parallel. As the secondary batteries, it is possible to use lithium ion secondary batteries, lithium polymer secondary batteries, nickel-metal hydride batteries, or the like. Alternatively or additionally to the secondary batteries, it is possible to use capacitors such as electric double layer capacitors (EDLCs). In the present specification, the secondary batteries include capacitors.
Vehicle-Side Load 16

The vehicle-side load 16 is formed, for example, by connecting, in parallel, a large-capacitance capacitor 18 having a capacitance of 200 µF to 5000 µF to a DC/AC inverter 20 serving as a load. When the main relay 14 is switched on in a state in which the capacitor 18 is fully discharged, an extremely large charge current for charging the capacitor 18 instantaneously flows through the capacitor 18. Since an extremely large charge current may damage the connection portion of the main relay 14, the pre-charge circuit 30 is provided to prevent damage caused by the charge current. As shown in FIG. 2, in Embodiment 1 of the present disclosure, the pre-charge circuit 30 is provided in parallel with the main relay 14. In the pre-charge circuit 30, the pre-charge resistors 28 are connected in series with the pre-charge relay 26 in order to limit the charge current of the capacitor 18. The pre-charge resistors 28 limit the charge current of the capacitor 18 to a small current in a state in which the pre-charge relay 26 and the main relay 14 are switched on. Note that the resistance values of the two pre-charge resistors 28 may be the same or different. Alternatively, only one of the pre-charge resistor 28 may be provided.

The vehicle-side load 16 connects the battery 12 to the motor 22 and a generator 24 via the DC/AC inverter 20. The DC/AC inverter 20 converts a direct current of the battery 12 into an alternating current, and supplies the alternating current to the motor 22, and the DC/AC inverter 20 converts an alternating current of the generator 24 to a direct current, and charges the battery 12. Note that FIG. 2 shows a hybrid car or a plug-in hybrid car. An electric car that is not equipped with a generator supplies power to a motor via the DC/AC inverter 20, and during regenerative braking, the electric car uses the motor as a generator, or charges a battery block using a generator that is provided separately. Although the DC/AC inverter 20 is used in Embodiment 1 of the present disclosure, it is also possible to use a DC/DC converter.

In Embodiment 1 of the present disclosure, as shown in FIG. 2, the capacitor 18 is pre-charged as a result of the control circuit (not shown) switching on the pre-charge relay 26. After the capacitor 18 has been pre-charged, the main relay 14 is switched on, thereby preventing the connection portion of the main relay 14 from being damaged by the charge current of the capacitor 18.

Figure 1:
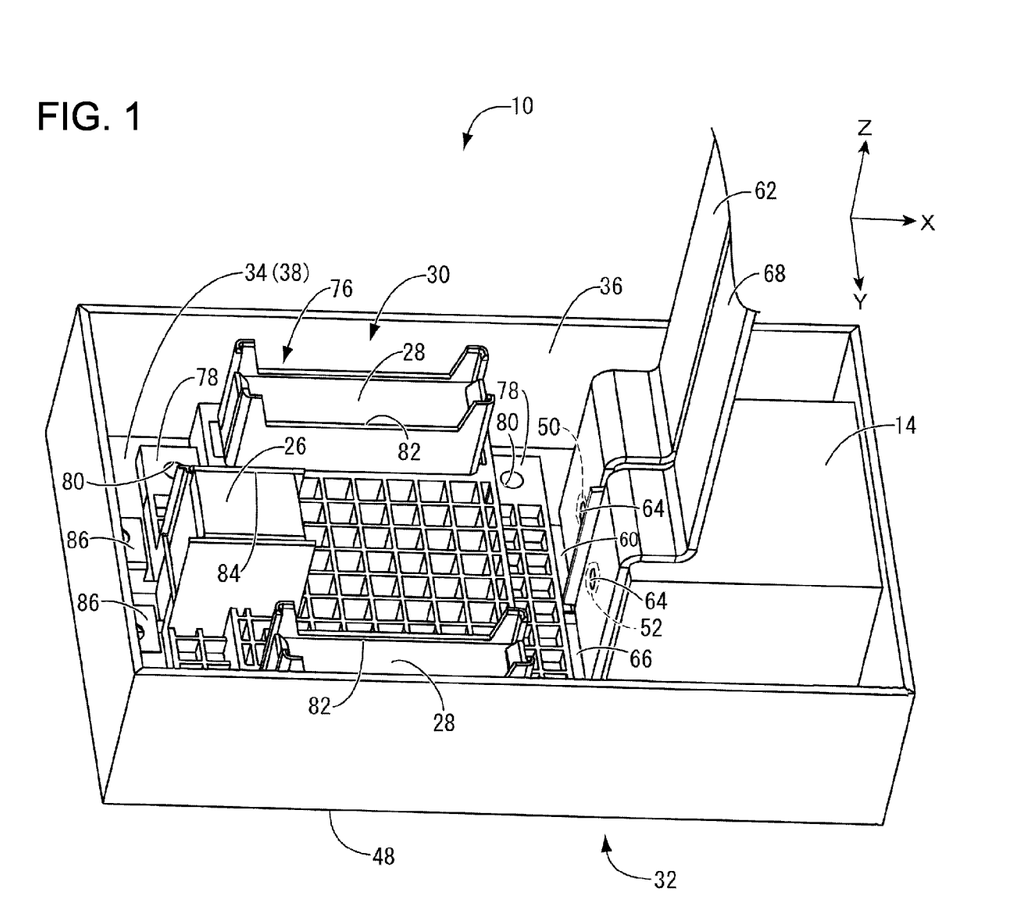
FIG. 1 is a perspective view showing a circuit assembly according to Embodiment 1 of the present disclosure.
Figure 2:
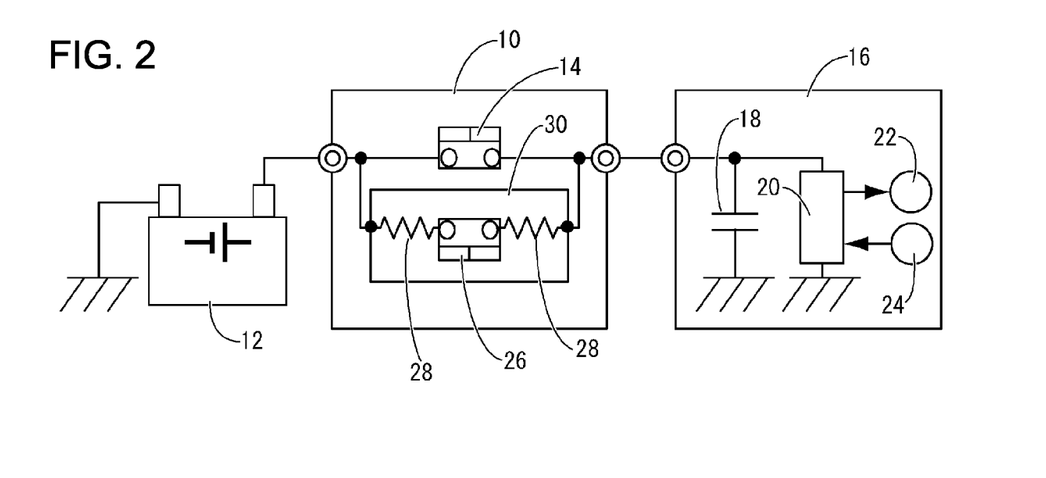
FIG. 2 is a diagram schematically showing an electrical configuration on a path extending from a battery to a load.
Figure 3:
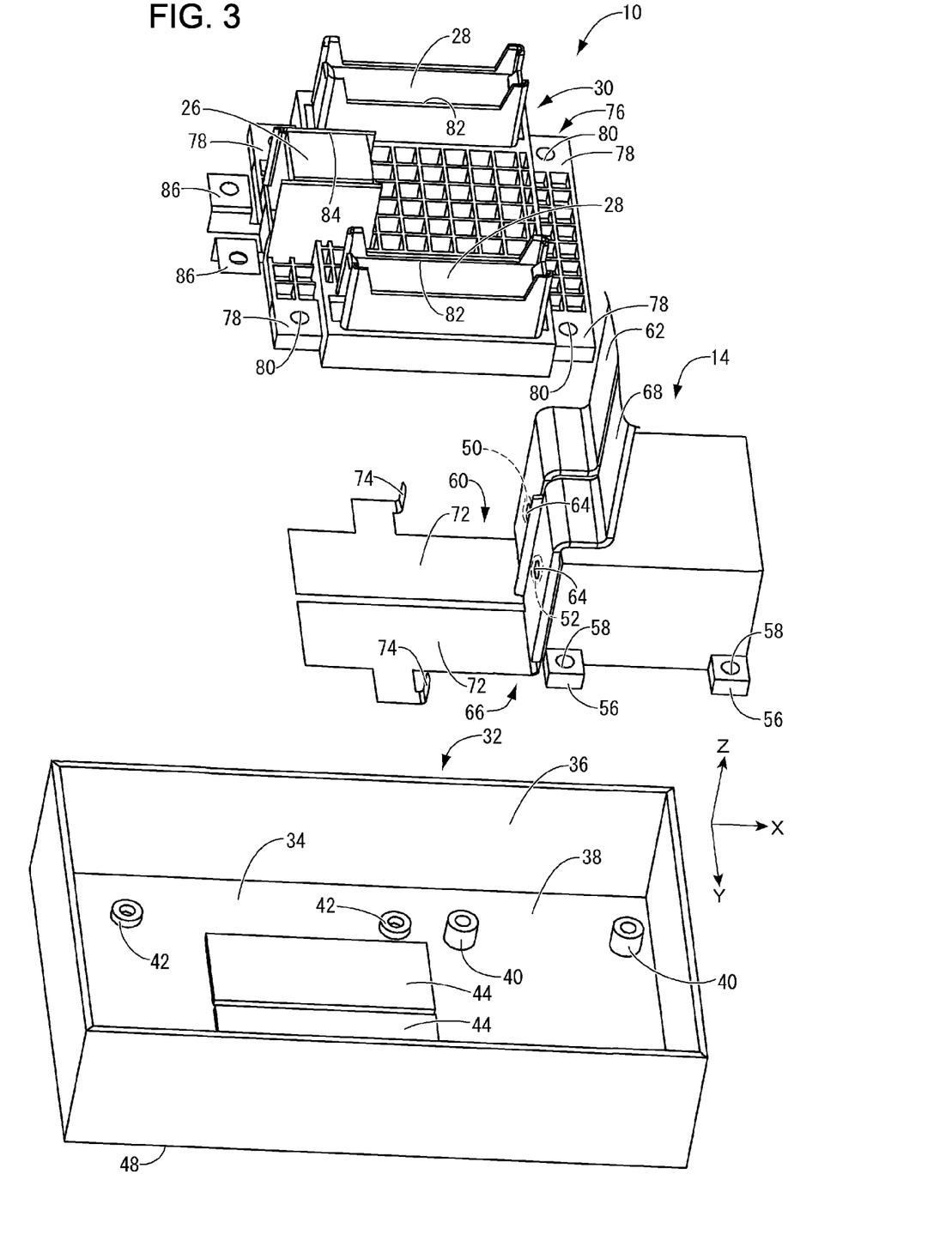
FIG. 3 is an exploded perspective view of the circuit assembly shown in FIG. 1.

As shown in FIGS. 1 and 3, for example, the circuit assembly 10 includes a case 32, and the main relay 14 and the pre-charge circuit 30 that are disposed in the case 32.
Case 32

The case 32 is formed by injection molding an insulating synthetic resin into a predetermined shape. The synthetic resin that forms the case 32 may contain a filler such as glass fiber. As shown in FIG. 3, for example, the case 32 has an overall shape of a substantially rectangular box member that is open upward, and has a bottom wall 34, and a peripheral wall 36 protruding upward from edge portions of the bottom wall 34. In Embodiment 1 of the present disclosure, the outer shape of the case 32 is substantially rectangular, as viewed from above. Note that the outer shape of the case 32 is not limited to the shape of the present embodiment.

Figure 4:
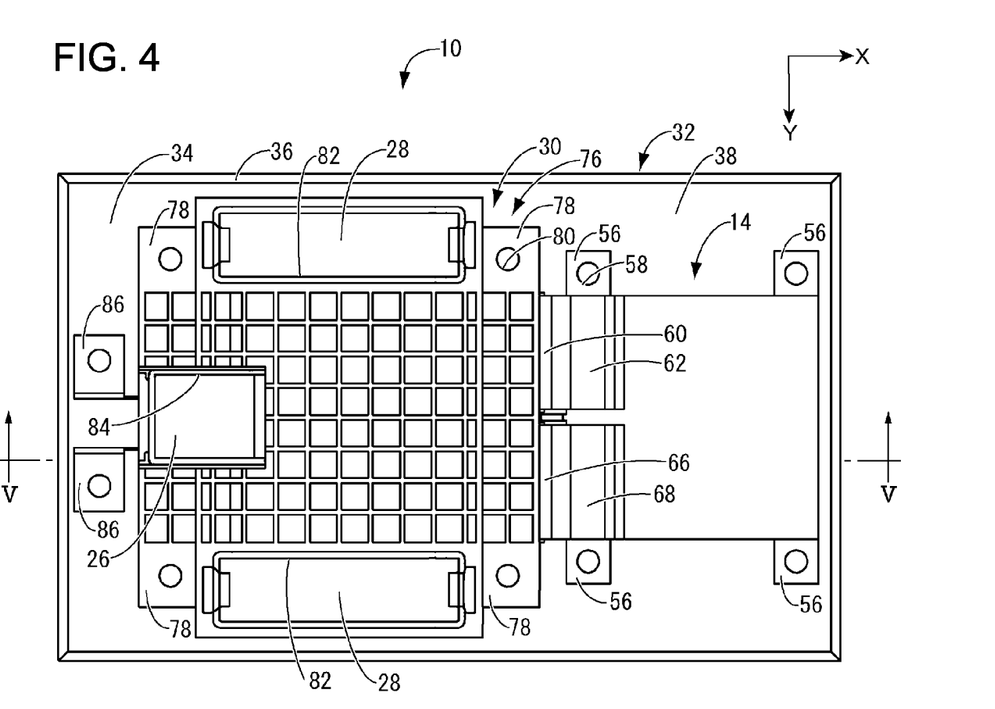
FIG. 4 is a plan view of the circuit assembly shown in FIG. 1.

As shown in FIGS. 3 and 4, first fixing portions 40 each having a cylindrical shape are provided on the right side of an upper surface 38 of the bottom wall 34 of the case 32 so as to protrude from four portions located along the peripheral wall 36. Also, second fixing portions 42 each having a cylindrical shape are provided on the left side of the upper surface 38 of the bottom wall 34 of the case 32 so as to protrude, with a height smaller than the height of the first fixing portions 40, from four portions located along the peripheral wall 36. All of the fixing portions 40 and 42 are molded integrally with the case 32, and are configured to allow bolts (not shown) to be inserted therein.
First Heat Transfer Sheet 44 and Second Heat Transfer Sheet 46

Figure 5:
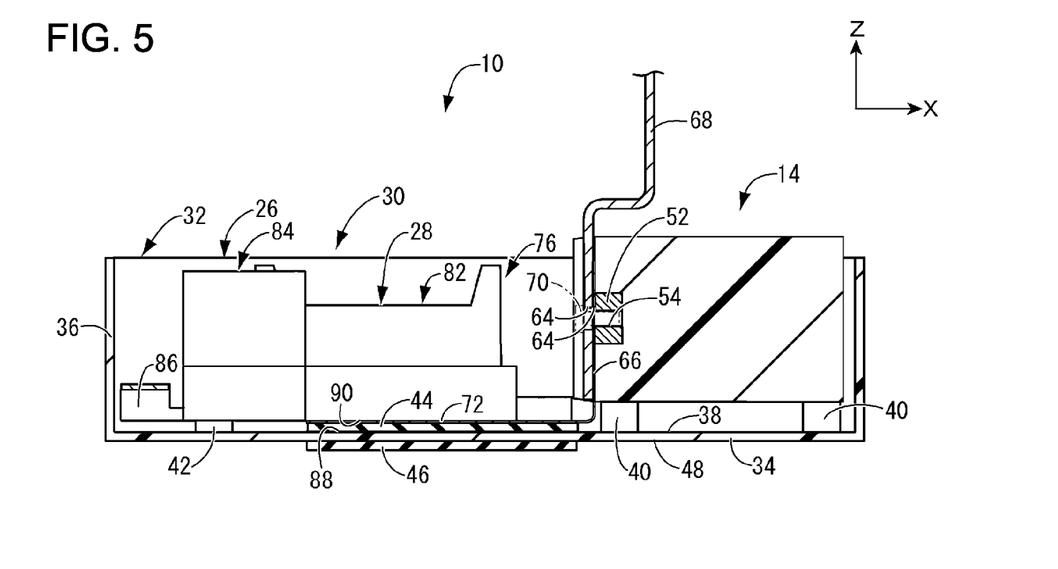
FIG. 5 is a cross-sectional view taken along the line V-V in FIG. 4.

As shown in FIG. 3, in the vicinity of the center of the upper surface 38 of the bottom wall 34 of the case 32, two substantially rectangular, planar first heat transfer sheets 44 that form heat transfer members are arranged in parallel with a slight gap therebetween in the front-rear direction. As shown in FIG. 5, in the vicinity of the center of a lower surface 48 of the bottom wall 34 of the case 32, two rectangular, planar second heat transfer sheets 46 that form heat transfer members are arranged in parallel with a slight gap therebetween in the front-rear direction. The first heat transfer sheets 44 and the second heat transfer sheets 46 have substantially the same shape, and the second heat transfer sheets 46 and the first heat transfer sheets 44 are disposed opposed to each other with the case 32 interposed therebetween.

The first heat transfer sheets 44 and the second heat transfer sheets 46 each have the shape of a sheet that is flat in a vertical direction, and are made of a synthetic resin having a thermal conductivity higher than that of air. The first heat transfer sheets 44 are flexible, and the thickness thereof can be changed according to a force applied thereto in the vertical direction.
Main Relay 14

The main relay 14 is a so-called mechanical relay and includes therein a connection portion and a coil portion, which are not shown. For example, as shown in FIGS. 1 and 5, a first power terminal 50 provided on the rear side and a second power terminal 52 provided on the front side are arranged on a left side surface of the main relay 14 in the front-rear direction. As a result of passing a current through the first power terminal 50 and the second power terminal 52, heat is generated in the connection portion of the main relay 14, and the heat is conducted to the first power terminal 50 and the second power terminal 52. A screw hole 54 is formed in each of the first power terminal 50 and the second power terminal 52 (see FIG. 5).

As shown in FIG. 4, fixing leg portions 56 each having a substantially rectangular shape as viewed from above protrude from lower end portions at four corners of the main relay 14. An insertion hole 58 extending in the vertical direction is formed in each of the fixing leg portions 56 (see FIG. 4). As a result of screws (not shown) being inserted into the insertion holes 58 in a state in which the main relay 14 is accommodated on the right side of the case 32 and the fixing leg portions 56 are placed on the first fixing portions 40, the main relay 14 is fixed to the case 32.

As shown in FIG. 3, one end portion of a first current-carrying portion 60 formed by a thin bus bar having a substantially L-shape, and one end portion of a thick first bus bar 62 having a substantially crank shape are fastened together and fixed to the first power terminal 50. That is, by screwing a screw (not shown) into the screw hole 54 of the first power terminal 50 through insertion holes 64 provided at the center of the one end portions of the first current-carrying portion 60 and the first bus bar 62 so as to extend therethrough, the one end portions are fastened together and fixed. As shown in FIGS. 3 and 5, one end portion of a second current-carrying portion 66 formed by a thin bus bar having a substantially L-shape, and one end portion of a thick second bus bar 68 having a substantially crank shape are fastened together and fixed to the second power terminal 52. That is, by screwing a screw 70 into the screw hole 54 of the second power terminal 52 through insertion holes 64 provided at the center of the one end portions of the second current-carrying portion 66 and the second bus bar 68 so as to extend therethrough, the one end portions are fastened together and fixed. For example, the first bus bar 62 is connected to the input side of the circuit assembly 10, and the second bus bar 68 is connected to the output side of the circuit assembly 10.

As shown in FIGS. 3 and 5, in a state in which the main relay 14 is accommodated in the case 32, the other end portion side of each of the first current-carrying portion 60 and the second current-carrying portion 66 extends parallel to the upper surface 38 of the bottom wall 34 of the case 32, and constitutes a heat transfer member abutment portion 72. Accordingly, when the main relay 14 is accommodated in and mounted to the case 32, the heat transfer member abutment portions 72 of the first current-carrying portion 60 and the second current-carrying portion 66 are disposed abutted against the first heat transfer sheets 44 placed on the upper surface 38 of the bottom wall 34 of the case 32. Additionally, each of the heat transfer member abutment portions 72 is provided with a resistor connection portion 74 protruding outward and extending upward.

Note that the current-carrying portions 60 and 66, and the bus bars 62 and 68 are each formed by pressing a metal plate material into a predetermined shape. As the metal that forms the current-carrying portions 60 and 66, and the bus bars 62 and 68, any metal having high thermal conductivity and low electrical resistance, such as copper, a copper alloy, aluminum, and an aluminum alloy can be selected as appropriate.

Pre-Charge Circuit 30

As shown in FIGS. 3 to 5, the pre-charge circuit 30 is held on a holding pedestal 76. The holding pedestal 76 is formed by injection molding an insulating synthetic resin into a predetermined shape, and has an overall shape of a flat, substantially rectangular plate. The synthetic resin that forms the holding pedestal 76 may contain a filler such as glass fiber. Fixing portions 78 each having a rectangular shape as viewed from above protrude from four corners of the holding pedestal 76. An insertion hole 80 extending in the vertical direction is formed in each of the fixing portions 78 (see FIG. 3). As shown in FIG. 3, on an upper surface of the holding pedestal 76, pre-charge resistor mounting portions 82 protrude upward on the front side and the rear side, and a pre-charge relay mounting portion 84 protrudes upward on the left side. The pre-charge resistors 28 and the pre-charge relay 26 are mounted to the pre-charge resistor mounting portions 82 and the pre-charge relay mounting portion 84, respectively, and various bus bars including input bus bars 86 for the pre-charge relay 26 are mounted from a lower surface of the holding pedestal 76. Consequently, the pre-charge circuit 30 held on the holding pedestal 76 is formed (see FIG. 2).

Pre-Charge Resistors 28

For example, as shown in FIG. 3, the pre-charge resistors 28 each have a rectangular parallelepiped shape that is elongated in a lateral direction. A lead terminal (not shown) protrudes downward from each left and right end portion of each of the pre-charge resistors 28.

Pre-Charge Relay 26

For example, as shown in FIG. 3, the pre-charge relay 26 is a so-called mechanical relay and has a rectangular parallelepiped shape that is smaller than the main relay 14, and includes therein a connection portion and a coil portion, which are not shown. A plurality of lead terminals (not shown) protrude downward from the lower surface of the pre-charge relay 26.

Process of Assembling Circuit Assembly 10

Next, an example of the process of assembling the circuit assembly 10 will be described. The process of assembling the circuit assembly 10 is not limited to the following description.

First, the case 32 is prepared. Next, the two first heat transfer sheets 44 and the two second heat transfer sheets 46 are each cut out into a predetermined shape by a known method such as Thompson punching. The two first heat transfer sheets 44 are attached to predetermined positions of the upper surface 38 of the bottom wall 34 of the case 32, and the two second heat transfer sheets 46 are attached to predetermined positions of the lower surface 48 of the bottom wall 34 of the case 32.

The main relay 14 is accommodated from above in the case 32 to which the heat transfer sheets 44 and 46 are attached. The main relay 14 is fixed to the case 32 by inserting the screws (not shown) into the insertion holes 58 in a state in which the fixing leg portions 56 of the main relay 14 are placed on the first fixing portions 40 provided on the case 32. In a state in which the main relay 14 is accommodated in and fixed to the case 32, the other end portion side of each of the first current-carrying portion 60 and the second current-carrying portion 66 extends parallel to the upper surface 38 of the bottom wall 34 of the case 32, and constitutes a heat transfer member abutment portion 72. Accordingly, the heat transfer member abutment portions 72 of the first current-carrying portion 60 and the second current-carrying portion 66 are disposed abutted against the first heat transfer sheets 44 placed on the upper surface 38 of the bottom wall 34 of the case 32.

Next, the holding pedestal 76 on which the pre-charge circuit 30 is held is accommodated on the right side of the case 32 from above. The holding pedestal 76 on which the pre-charge circuit 30 is held is fixed to the case 32 by inserting screws (not shown) into the insertion holes 80 in a state in which the fixing portions 78 of the holding pedestal 76 are placed on the second fixing portions 42 provided on the case 32. Consequently, the resistor connection portion 74 provided on the other end portion side of each of the first current-carrying portion 60 and the second current-carrying portion 66 is connected to the lead terminals (not shown) of the corresponding pre-charge resistor 28 via the relay terminals (not shown), whereby a circuit assembly 10 is completed.

In this state, for example, as shown in FIG. 5, the heat transfer member abutment portions 72 formed by the other end portion sides of the first current-carrying portion 60 and the second current-carrying portion 66, respectively, and the first heat transfer sheets 44 are disposed between the abutment surfaces 88 and 90 of the case 32 and the holding pedestal 76. That is, the first heat transfer sheets 44 are provided in contact with the heat transfer member abutment portions 72 of the first and second current-carrying portions 60 and 66 of the pre-charge circuit 30 that are connected to the bus bars 62 and 68 of the main relay 14. The respective abutment surfaces 88 and 90 of the case 32 and the holding pedestal 76 are each planar, and the heat transfer member abutment portions 72 are disposed such that opposite surfaces of each of the heat transfer member abutment portions 72 in the plate thickness direction thereof abut against the holding pedestal 76 and the corresponding first heat transfer sheet 44, respectively. As a result, the heat transfer member abutment portions 72 and the first heat transfer sheets 44 are pressed against the case 32 by the holding pedestal 76.

Next, operations and effects of the present embodiment will be described. According to the present embodiment, in the pre-charge circuit 30 provided in the vicinity of the main relay 14, the first heat transfer sheets 44 serving as the heat transfer members are provided in contact with the heat transfer member abutment portions 72, which are parts of the first and second current-carrying portions 60 and 66 connected to the first and second power terminals 50 and 52 of the main relay 14. With this configuration, in the vicinity of the main relay 14, the heat generated in the main relay 14 can be quickly transferred via the first heat transfer sheets 44, thus making it possible to efficiently dissipate heat from the main relay 14. In addition, an existing pre-charge circuit may be directly used as the existing pre-charge circuit 30, and the heat transfer members may simply be provided at the heat transfer member abutment portions 72, which are parts of the first and second current-carrying portions 60 and 66. Accordingly, there is no need to extend a large bus bar over a long distance for heat dissipation as in the case of conventional structures. Therefore, it is possible to realize a heat dissipation structure of the main relay 14 with a simple structure, while suppressing an increase in cost. Moreover, even when the overall surface area of the heat transfer member abutment portions 72 of the first and second current-carrying portions 60 and 66 of the pre-charge circuit 30 is increased in order to increase the heat transfer efficiency and the like, the current-carrying portions have a smaller cross-sectional area as compared with the case where the surface area of the conventional current-carrying portions that connect the main relay 14 and the battery 12 is increased. Therefore, it is possible to suppress an increase in cost.

With the above-described configuration, the planar first heat transfer sheets 44, which are provided in contact with the heat transfer member abutment portions 72 of the first and second current-carrying portions 60 and 66 connected to the first and second power terminals 50 and 52 of the main relay 14 in the pre-charge circuit 30, are held between the heat transfer member abutment portions 72 and the bottom wall 34 of the case 32. Accordingly, the heat generated in the main relay 14 can be transferred to the case 32 via the first and second current-carrying portions 60 and 66 and the first heat transfer sheets 44, without being transferred through an air layer. As a result, it is possible to construct a more efficient heat transfer path of the main relay 14, and a heat dissipation structure using the same. Moreover, since existing components are directly used as the case 32 and the pre-charge circuit 30, it is possible to construct a heat transfer path of the main relay 14 with a simple structure and good space efficiency, and a heat dissipation structure using the same.

Furthermore, the second heat transfer sheets 46 disposed opposed to the first heat transfer sheets 44 with the case 32 interposed therebetween are provided. Accordingly, the heat of the main relay 14 can be more efficiently transferred to the outside via the second heat transfer sheets 46, and it is thus possible to construct a heat transfer path of the main relay 14 that utilizes a larger area, and realize more stable heat dissipation of the main relay 14.

Additionally, the heat transfer member abutment portions 72 and the first heat transfer sheets 44 are disposed between the abutment surfaces 88 and 90 of the holding pedestal 76 and the case 32 by using the existing gap between the holding pedestal 76 and the case 32. Accordingly, the heat transfer path of the main relay 14 can be provided in the gap between the holding pedestal 76 and the case 32 with good space efficiency. Moreover, the heat transfer member abutment portions 72 and the first heat transfer sheets 44 are pressed using the fixing force of the holding pedestal 76 to the case 32. This makes it possible to prevent loss, for example, through an air layer in the above-described heat transfer path without requiring any additional component, thus advantageously enhancing the stability and the performance of the heat transfer path.

With the above-described configuration, the heat transfer member abutment portions 72 and the first heat transfer sheets 44 that are planar can be sandwiched between the planar abutment surfaces 88 and 90 of the case 32 and the holding pedestal 76 without any gap. Moreover, since the first heat transfer sheets 44 are flexible, any dimensional tolerances that occur in the case 32, the holding pedestal 76, and the heat transfer member abutment portions 72 can be absorbed by deformation of the first heat transfer sheets 44. Therefore, it is possible to reliably secure the contact area between the members constituting the heat transfer path of the main relay 14, thus enhancing the heat transfer performance.

Modifications

Although Embodiment 1 has been described above in detail as a specific example of the present disclosure, the present disclosure is not intended to be limited by the specific description. Modifications, improvements, and the like in a range in which the object of the present disclosure can be achieved are encompassed by the present disclosure. For example, the following modifications of the embodiment are also included in the technical scope of the present disclosure.

(1) In the above embodiment, an example is shown in which, in the pre-charge circuit 30, the heat transfer members (the first heat transfer sheets 44 and the second heat transfer sheets 46) are provided at the first and second current-carrying portions 60 and 66 that establish a connection between the main relay 14 and the pre-charge resistors 28; however, the present disclosure is not limited thereto. In the case of using a current-carrying portion that establishes a conductive connection between the main relay 14 and the pre-charge relays 26, a heat transfer member may be provided at the heat transfer member abutment portion.

(2) It is, of course, possible to adopt a configuration in which the heat transfer path of the main relay 14 is formed in combination with a path extending from the main relay 14 to the battery 12. With this configuration, it is possible to make the heat transfer path of the main relay 14 more compact, and additionally utilize the heat transfer path between the main relay 14 and the battery 12 according to the present disclosure, which utilizes the pre-charge circuit 30.

(3) Additionally, as the heat transfer members provided at the first and second current-carrying portions 60 and 66, it is possible to use any heat transfer member formed by a member having a thermal conductivity higher than that of air. For example, alternatively or additionally to the insulating first heat transfer sheets 44, it is possible to use heat dissipation fins.

(4) In the above embodiment, the first heat transfer sheet 44 and the second heat transfer sheet 46 are each divided into two; however, they may each be an integral piece. This makes it possible to enhance the workability in formation and attachment.

(5) In Embodiment 1 above, an example is shown in which the structure of the present disclosure is applied to the circuit assembly 10 that breaks an electrical connection between the DC/AC inverter 20 to which the capacitor 18 is connected in parallel and the battery 12. The circuit assembly 10 of the present disclosure is similarly applicable to all circuit assemblies that break a connection between a different load to which the capacitor is connected in parallel and the battery 12.

LIST OF REFERENCE NUMERALS

10 Circuit assembly
12 Battery
14 Main relay
16 Vehicle-side load (load)
18 Capacitor
20 DC/AC inverter (load)
22 Motor
24 Generator
26 Pre-charge relay
28 Pre-charge resistor
30 Pre-charge circuit
32 Case
34 Bottom wall
36 Peripheral wall
38 Upper surface
40 First fixing portion
42 Second fixing portion
44 First heat transfer sheet (heat transfer member)
46 Second heat transfer sheet (heat transfer member)
48 Lower surface
50 First power terminal
52 Second power terminal
54 Screw hole
56 Fixing leg portion
58 Insertion hole
60 First current-carrying portion
62 First bus bar
64 Insertion hole
66 Second current-carrying portion
68 Second bus bar
70 Screw
72 Heat transfer member abutment portion
74 Resistor connection portion
76 Holding pedestal
78 Fixing portion
80 Insertion hole
82 Pre-charge resistor mounting portion
84 Pre-charge relay mounting portion
86 Input bus bar
88 Abutment surface
90 Abutment surface

The invention claimed is:

1. A circuit assembly comprising:
   a main relay configured to be electrically connected between a load and a battery;
   a pre-charge circuit connected in parallel with the main relay;
   a heat transfer member; and
   a case that accommodates the main relay and the pre-charge circuit,
   wherein the heat transfer member includes a planar first heat transfer sheet in contact with the case,
   wherein the pre-charge circuit includes a current-carrying portion configured to be connected to the main relay,
   wherein the heat transfer member and the current-carrying portion are in contact with each other, and
   wherein the heat transfer member includes a planar first heat transfer sheet in contact with the case such that the planar first heat transfer sheet and the case are contiguous.

2. The circuit assembly according to claim 1,
   wherein the heat transfer member includes a planar second heat transfer sheet disposed opposed to the first heat transfer sheet with the case interposed therebetween.

3. The circuit assembly according to claim 1, further comprising
   a holding pedestal configured to be fixed to the case so as to hold the pre-charge circuit,
   wherein the current-carrying portion and the first heat transfer sheet are disposed between the case and the holding pedestal, and the current-carrying portion and the first heat transfer sheet are pressed against the case as a result of the holding pedestal being fixed to the case.

4. The circuit assembly according to claim 3,
   wherein the current-carrying portion is formed by a planar bus bar,
   the bus bar is disposed such that opposite surfaces of the bus bar in a plate thickness direction thereof abut against the holding pedestal and the first heat transfer sheet,
   an abutment surface of each of the case and the holding pedestal is planar, and
   the first heat transfer sheet has flexibility.

* * * * *